United States Patent
Lee et al.

(10) Patent No.: US 11,489,516 B2
(45) Date of Patent: Nov. 1, 2022

(54) DESKEW CIRCUIT FOR DIFFERENTIAL SIGNAL

(71) Applicant: ALi Corporation, Hsinchu (TW)

(72) Inventors: Ming-Ta Lee, Taipei (TW); Ching-Chung Cheng, Taipei (TW)

(73) Assignee: ALi Corporation, Hsinchu (TW)

( * ) Notice: Subject to any disclaimer, the term of this patent is extended or adjusted under 35 U.S.C. 154(b) by 0 days.

(21) Appl. No.: 17/535,703

(22) Filed: Nov. 26, 2021

(65) Prior Publication Data
US 2022/0182047 A1    Jun. 9, 2022

(30) Foreign Application Priority Data
Dec. 3, 2020    (CN) .......................... 202011408779.2

(51) Int. Cl.
| | | |
|---|---|---|
| *H03K 5/00* | (2006.01) | |
| *H03K 5/003* | (2006.01) | |
| *H04L 25/02* | (2006.01) | |
| *H03K 5/15* | (2006.01) | |

(52) U.S. Cl.
CPC ............... *H03K 5/003* (2013.01); *H03K 5/15* (2013.01); *H04L 25/0276* (2013.01)

(58) Field of Classification Search
None
See application file for complete search history.

(56) References Cited

U.S. PATENT DOCUMENTS

| | | | | |
|---|---|---|---|---|
| 7,383,518 B1* | 6/2008 | Sonntag | .................... | H04L 1/20 |
| | | | | 716/132 |
| 8,305,113 B1* | 11/2012 | Payne | .................... | H03K 5/003 |
| | | | | 327/72 |
| 2003/0201802 A1* | 10/2003 | Young | ................... | H04L 25/085 |
| | | | | 327/108 |
| 2006/0220681 A1* | 10/2006 | Wong | ............. | H03K 19/017545 |
| | | | | 326/68 |
| 2012/0280720 A1 | 11/2012 | Payne | | |
| 2013/0154704 A1* | 6/2013 | Kim | ......................... | H03K 5/12 |
| | | | | 327/170 |
| 2013/0287084 A1* | 10/2013 | Bankman | ............ | H03F 3/45076 |
| | | | | 375/229 |

(Continued)

FOREIGN PATENT DOCUMENTS

TW    201810933    3/2018

*Primary Examiner* — Tuan T Lam
(74) *Attorney, Agent, or Firm* — JCIPRNET

(57) ABSTRACT

A deskew circuit for a differential signal is provided. A first common mode voltage generating circuit generates a first common mode voltage signal according to first and second differential input signals. A voltage buffer circuit is coupled to the first common mode voltage generating circuit and has an input impedance higher than a preset value, and buffers the first common mode voltage signal and the first and second differential input signals to generate a second common mode voltage signal, a third differential input signal, and a fourth differential input signal. A second common mode voltage generating circuit is coupled to the voltage buffer circuit and generates a third common mode voltage signal according to the third and fourth differential input signals. An output circuit generates a deskew output signal according to the third and fourth differential input signals and the second and third common mode voltage signals.

10 Claims, 4 Drawing Sheets

(56) References Cited

U.S. PATENT DOCUMENTS

| | | | |
|---|---|---|---|
| 2014/0159795 A1* | 6/2014 | Scouten | H04L 25/0276 327/333 |
| 2016/0173299 A1* | 6/2016 | Islam | H04L 25/03254 375/232 |
| 2017/0244581 A1* | 8/2017 | Islam | H04L 25/0296 |

* cited by examiner

DESKEW CIRCUIT FOR DIFFERENTIAL SIGNAL

CROSS-REFERENCE TO RELATED APPLICATION

This application claims the priority benefit of China application serial no. 202011408779.2, filed on Dec. 3, 2020. The entirety of the above-mentioned patent application is hereby incorporated by reference herein and made a part of this specification.

BACKGROUND

Technical Field

The disclosure relates to a differential signal receiving circuit, and in particular relates to a deskew circuit for differential signals.

Description of Related Art

When it comes to communication systems, differential circuits always perform better than single-ended circuits for they have higher linearity, anti-common mode interference signal performance, and so on. A differential signal pair needs to be transmitted together along two transmission paths close to each other through the same environment, thus effectively suppressing electromagnetic interference (EMI).

However, generally the lengths of the two transmission cables used to transmit the differential signal pair may be slightly different. As a result, the arrival times of the positive phase part and the negative phase part of the differential signal pair may be different, resulting in a delay skew of the differential signal pair. Now some solutions have been proposed to improve the delay skew of the differential signal pair, for example, disposing a delay device to compensate for the delay skew. However, considering that the transmission rate is constantly increasing and that the design of the differential signal receiver is required to meet the requirement of impedance matching, the design of a deskew circuit for improving the delay skew of the differential signal pair still faces many challenges.

SUMMARY

The disclosure provides a deskew circuit for a differential signal, which is adapted for applications of high-speed transmission while meeting the requirement of impedance matching.

An embodiment of the disclosure provides a deskew circuit for a differential signal, which includes a first common mode voltage generating circuit, a voltage buffer circuit, a second common mode voltage generating circuit, and an output circuit. The first common mode voltage generating circuit generates a first common mode voltage signal according to a first differential input signal and a second differential input signal. The voltage buffer circuit is coupled to the first common mode voltage generating circuit, and has an input impedance higher than a preset value. The voltage buffer circuit buffers the first common mode voltage signal, the first differential input signal, and the second differential input signal to generate a second common mode voltage signal, a third differential input signal, and a fourth differential input signal. The second common mode voltage generating circuit is coupled to the voltage buffer circuit, and generates a third common mode voltage signal according to the third differential input signal and the fourth differential input signal. The output circuit is coupled to the second common mode voltage generating circuit and the voltage buffer circuit, and generates a deskew output signal according to the third differential input signal, the fourth differential input signal, the second common mode voltage signal, and the third common mode voltage signal.

Based on the above, according to the embodiments of the disclosure, a voltage buffer circuit is provided between the first common mode voltage generating circuit and the second common mode voltage generating circuit. The voltage buffer circuit has a high input impedance to isolate the second common mode voltage generating circuit and the signal input terminal. Therefore, the circuit components in the second common mode voltage generating circuit do not affect the input impedance of the differential signal receiver. As a result, the circuit components in the second common mode voltage generating circuit can be set more flexibly while meeting the requirement of impedance matching specified by the transmission standard. Thus, the embodiments of the disclosure are suitable for applications of high-speed transmission.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
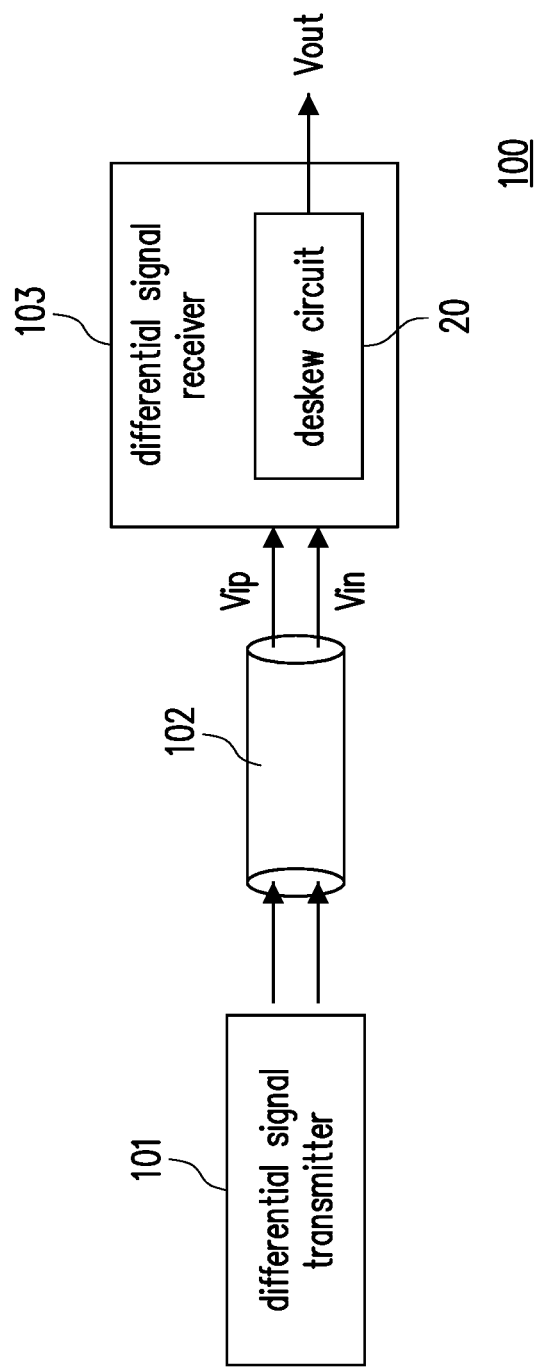
FIG. 1 is a schematic diagram of a differential signal transmission system according to an embodiment of the disclosure.

Reference will now be made in detail to the exemplary embodiments of the disclosure, and examples of the exemplary embodiments are illustrated in the accompanying drawings. The same reference numerals are used in the drawings and descriptions to denote the same or similar parts where appropriate.

FIG. 1 is a schematic diagram of a differential signal transmission system according to an embodiment of the disclosure. Referring to FIG. 1, the differential signal transmission system 100 includes a differential signal transmitter 101, a transmission cable 102, and a differential signal receiver 103. The disclosure does not impose restrictions on the signal transmission standard used by the differential signal transmission system 100, which may be the universal serial bus (USB) standard or the high definition multimedia interface (HDMI) standard, for example. For example, the differential signal transmitter 101 may be a USB signal transmitter, the transmission cable 102 may be a USB transmission cable, and the differential signal receiver 103 may be a USB signal receiver.

The differential signal transmitter 101 may transmit a signal through the transmission cable 102. For example, the transmission cable 102 may be any suitable type of connection, such as a coaxial cable, a twisted pair, and any type of transmission bus, to provide a connection between the differential signal transmitter 101 and the differential signal receiver 103. The differential transmission signals Vip and Vin may be provided to the signal receiving terminal of the differential signal receiver 103 through the transmission cable 102. It should be noted that when the differential transmission signals Vip and Vin are transmitted from the transmission cable 102 to the differential signal receiver 103, the transmission line impedance of the transmission cable 102 and the terminal impedance of the differential signal receiver 103 need to match each other so as to prevent signal reflection from affecting the signal transmission quality.

The differential signal receiver 103 includes a deskew circuit 20. The deskew circuit 20 may generate a deskew output signal Vout according to the differential transmission signals Vip and Vin. The deskew output signal Vout is an output signal generated by deskew processing the voltage difference between the differential transmission signals Vip and Vin. The deskew output signal Vout may be composed of a series of pulse waves, and the waveform of these pulse waves is related to the bit data to be transmitted.

Figure 2:
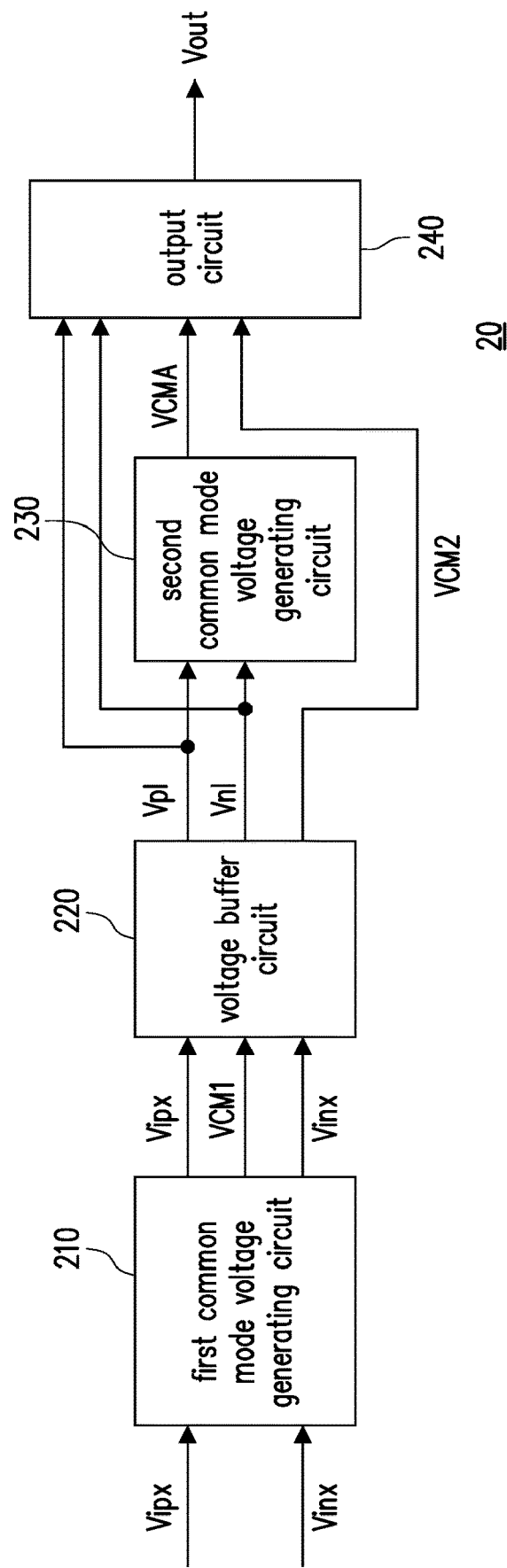
FIG. 2 is a block diagram of a deskew circuit of a differential signal receiver according to an embodiment of the disclosure.

FIG. 2 is a block diagram of the deskew circuit of the differential signal receiver according to an embodiment of the disclosure. Referring to FIG. 2, the deskew circuit 20 includes a first common mode voltage generating circuit 210, a voltage buffer circuit 220, a second common mode voltage generating circuit 230, and an output circuit 240. The first common mode voltage generating circuit 210 generates a first common mode voltage signal VCM1 according to a first differential input signal Vipx and a second differential input signal Vinx so that the amplitude of the first common mode voltage signal VCM1 is determined according to the first differential input signal Vipx and the second differential input signal Vinx. In an embodiment, the first differential input signal Vipx and the second differential input signal Vinx may be the same as or different from the differential transmission signals Vip and Vin, depending on the circuit configuration between the first common mode voltage generating circuit 210 and the signal receiving terminal. In an embodiment, the first common mode voltage signal VCM1 may be generated according to the bias voltage provided by a voltage source so that the actual voltage range of the first common mode voltage signal VCM1 is determined according to the bias voltage provided by the voltage source.

The voltage buffer circuit 220 is coupled to the first common mode voltage generating circuit 210. The voltage buffer circuit 220 has an input impedance, and the input impedance of the voltage buffer circuit 220 is higher than a preset value. For example, the input impedance of the voltage buffer circuit 220 may be in the Mega ohms level. The aforementioned preset value is, for example, 1 million ohms, but the disclosure is not limited thereto. The voltage buffer circuit 220 has the characteristics of high input impedance and low output impedance, and can isolate the influence of the previous circuit and the subsequent circuit on each other. The voltage buffer circuit 220 is configured to buffer the first common mode voltage signal VCM1, the first differential input signal Vipx, and the second differential input signal Vinx to generate a second common mode voltage signal VCM2, a third differential input signal Vp1, and a fourth differential input signal Vn1. In an embodiment, the voltage buffer circuit 220 may be a unity gain buffer circuit or a level shifter circuit, and can keep the voltage phase and voltage swing of the output voltage signal the same as the voltage phase and voltage swing of the input signal. In other words, the first common mode voltage signal VCM1 and the second common mode voltage signal VCM2 have the same phase and the same voltage swing; the first differential input signal Vipx and the third differential input signal Vp1 have the same phase and the same voltage swing; and the second differential input signal Vinx and the fourth differential input signal Vn1 have the same phase and the same voltage swing. Specifically, in an embodiment, the voltage buffer circuit 220 may include a plurality of voltage buffers, and the voltage buffers are configured to buffer the first common mode voltage signal VCM1, the first differential input signal Vipx, and the second differential input signal Vinx respectively.

The second common mode voltage generating circuit 230 is coupled to the voltage buffer circuit 220, and generates the third common mode voltage signal VCMA according to the third differential input signal Vp1 and the fourth differential input signal Vn1. Specifically, the second common mode voltage generating circuit 230 receives the third differential input signal Vp1 and the fourth differential input signal Vn1 from the voltage buffer circuit 220 to generate the third common mode voltage signal VCMA between the third differential input signal Vp1 and the fourth differential input signal Vn1. The third common mode voltage signal VCMA is the average voltage value of the third differential input signal Vp1 and the fourth differential input signal Vn1. It should be noted that the first common mode voltage generating circuit 210 and the second common mode voltage generating circuit 230 generate the first common mode voltage signal VCM1 and the third common mode voltage signal VCMA according to different impedance values.

The output circuit 240 is coupled to the second common mode voltage generating circuit 230 and the voltage buffer circuit 220. The output circuit 240 generates a deskew output signal Vout according to the third differential input signal Vp1, the fourth differential input signal Vn1, the second common mode voltage signal VCM2, and the third common mode voltage signal VCMA. Specifically, the output circuit 240 may adjust the voltage difference between the third differential input signal Vp1 and the fourth differential input signal Vn1 according to the comparison result between the second common mode voltage signal VCM2 and the third common mode voltage signal VCMA so as to generate the deskew output signal Vout.

It is worth mentioning that by disposing the voltage buffer circuit 220 between the first common mode voltage generating circuit 210 and the second common mode voltage generating circuit 230, the second common mode voltage generating circuit 230 of the subsequent stage is prevented from becoming a load of the first common mode voltage generating circuit 210 of the previous stage. Accordingly, the second common mode voltage generating circuit 230 does not affect the terminal impedance of the differential signal receiver 103. Therefore, the impedance configuration of the circuit components inside the second common mode voltage generating circuit 230 is more flexible and is not restricted by impedance matching. If the impedance of the circuit components inside the second common mode voltage generating circuit 230 is reduced, the differential signal receiver 103 is more suitable for high-speed transmission.

Figure 3:
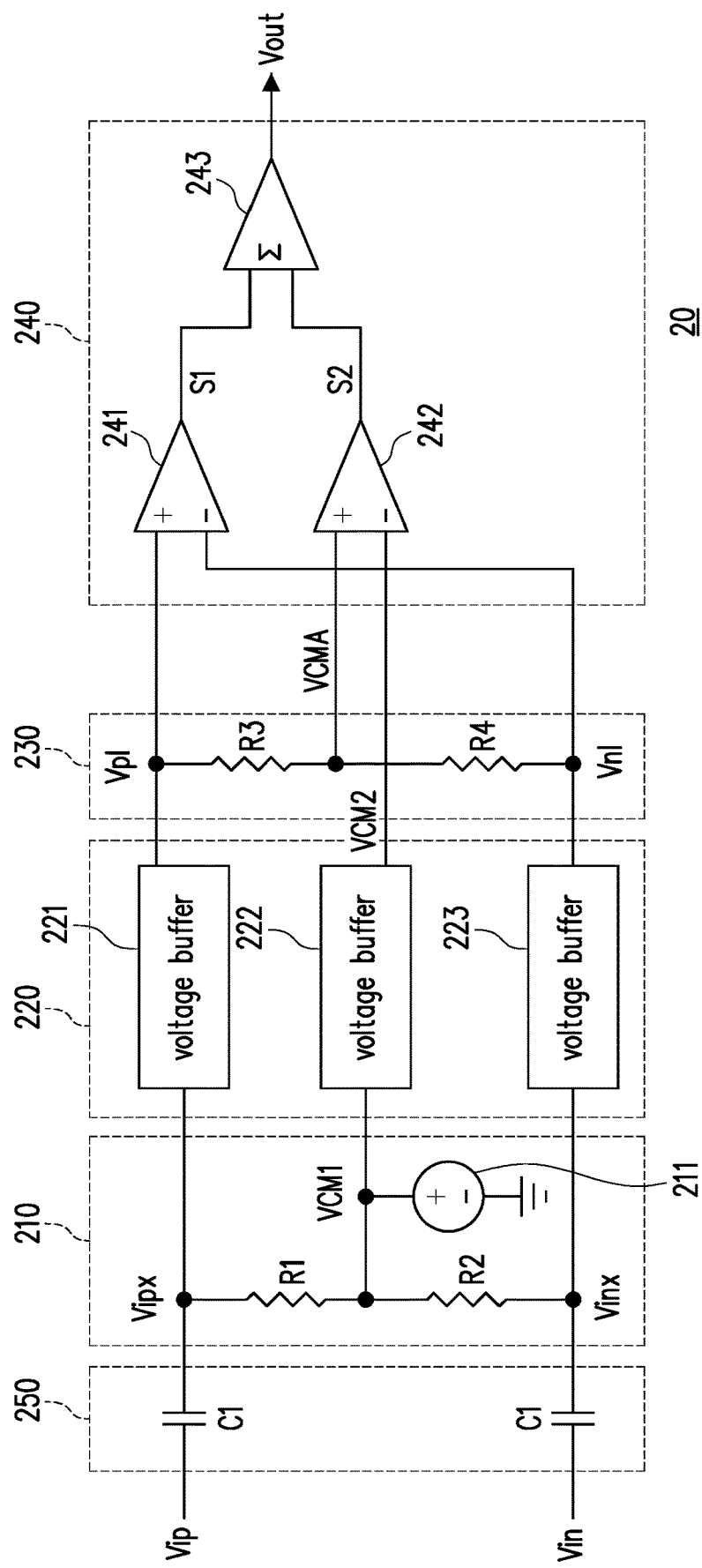
FIG. 3 is a circuit diagram of a deskew circuit of a differential signal receiver according to an embodiment of the disclosure.

FIG. 3 is a circuit diagram of the deskew circuit of the differential signal receiver according to an embodiment of the disclosure. Referring to FIG. 3, the deskew circuit 20 further includes a coupling circuit 250 in addition to the first common mode voltage generating circuit 210, the voltage buffer circuit 220, the second common mode voltage generating circuit 230, and the output circuit 240.

In this embodiment, the coupling circuit 250 is coupled to the first common mode voltage generating circuit 210, and receives the differential transmission signals Vip and Vin to generate the first differential input signal Vipx and the second differential input signal Vinx according to the capacitance value. Specifically, the coupling circuit 250 includes capacitors C1 and C2, and the capacitance values of the capacitors C1 and C2 are the same. One terminal of the capacitor C1 receives the differential transmission signal Vip, and the other terminal of the capacitor C1 outputs the first differential input signal Vipx. One terminal of the capacitor C2 receives the differential transmission signal Vin, and the other terminal of the capacitor C2 outputs the second differential input signal Vinx. Through the AC coupling of the capacitors C1 and C2, the capacitors C1 and C2 isolate the DC components of the differential transmission signals Vip and Vin, which allows the first common mode voltage signal VCM1 to be flexibly set. Accordingly, if the first common mode voltage signal VCM1 generated by the first common mode voltage generating circuit 210 can be adjusted according to the requirement, the output circuit 240 of the subsequent stage can be designed more easily.

In this embodiment, the voltage buffer circuit 220 includes a first voltage buffer 221, a second voltage buffer 222, and a third voltage buffer 223. The first voltage buffer 221 is configured to buffer the first differential input signal Vipx to generate the third differential input signal Vp1. The second voltage buffer 222 is configured to buffer the first common mode voltage signal VCM1 to generate the second common mode voltage signal VCM2. The third voltage buffer 223 is configured to buffer the second differential input signal Vinx to generate the fourth differential input signal Vn1. In an embodiment, each of the first voltage buffer 221, the second voltage buffer 222, and the third voltage buffer 223 is a unity gain amplifier circuit having high input impedance and low output impedance. For example, each of the first voltage buffer 221, the second voltage buffer 222, and the third voltage buffer 223 may be a voltage follower or a source follower.

Figure 4:
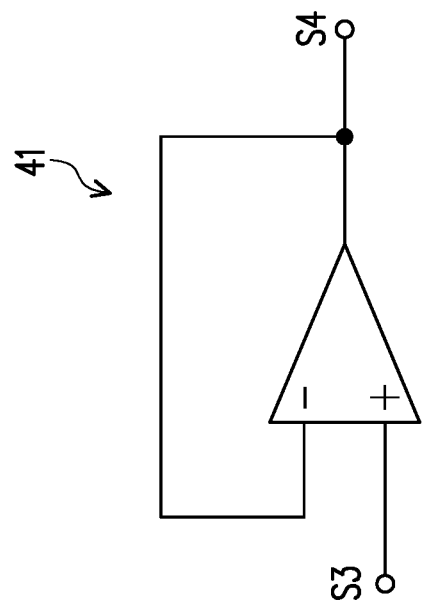
FIG. 4 is a schematic diagram of a voltage buffer according to an embodiment of the disclosure.

FIG. 4 is a schematic diagram of the voltage buffer according to an embodiment of the disclosure. Referring to FIG. 4, in this embodiment, each of the first voltage buffer 221, the second voltage buffer 222, and the third voltage buffer 223 is implemented as a voltage follower 41. The negative input terminal of the voltage follower 41 is coupled to the output terminal thereof, and the positive input terminal of the voltage follower 41 is configured to receive an input signal S3. The output terminal of the voltage follower 41 provides an output signal S4. For the first voltage buffer 221, the input signal S3 of the voltage follower 41 is the first differential input signal Vipx, and the output signal S4 of the voltage follower 41 is the third differential input signal Vp1. For the second voltage buffer 222, the input signal S3 of the voltage follower 41 is the first common mode voltage signal VCM1, and the output signal S4 of the voltage follower 41 is the second common mode voltage signal VCM2. For the third voltage buffer 223, the input signal S3 of the voltage follower 41 is the second differential input signal Vinx, and the output signal S4 of the voltage follower 41 is the fourth differential input signal Vn1.

Referring to FIG. 3 again, the first common mode voltage generating circuit 210 includes a first resistor R1 and a second resistor R2. The first common mode voltage generating circuit 210 may determine the first common mode voltage signal VCM1 between the first differential input signal Vipx and the second differential input signal Vinx through the bias voltage provided by the first resistor R1, the second resistor R2, and the voltage source 211. In an embodiment, the resistance value of the first resistor R1 is the same as the resistance value of the second resistor R2. One terminal of the first resistor R1 receives the first differential input signal Vipx and is coupled to the input terminal of the first voltage buffer 221. One terminal of the second resistor R2 receives the second differential input signal Vinx and is coupled to the input terminal of the third voltage buffer 223. The other terminal of the first resistor R1 is coupled to the other terminal of the second resistor R2. In addition, the other terminal of the first resistor R1 and the other terminal of the second resistor R2 are also coupled to the voltage source 211 and output the first common mode voltage signal VCM1 to the second voltage buffer 222. The voltage source 211 may be a DC voltage source or an AC voltage source, which is not particularly limited in the disclosure. Specifically, the first resistor R1 and the second resistor R2 may be configured to detect the average voltage value of the first differential input signal Vipx and the second differential input signal Vinx, and the average voltage value is carried by the voltage provided by the voltage source 211 so as to generate the first common mode voltage signal VCM1.

The second common mode voltage generating circuit 230 includes a third resistor R3 and a fourth resistor R4. The second common mode voltage generating circuit 230 may detect the third common mode voltage signal VCMA between the third differential input signal Vp1 and the fourth differential input signal Vn1 through the third resistor R3 and the fourth resistor R4. In an embodiment, the resistance value of the third resistor R3 is the same as the resistance value of the fourth resistor R4. One terminal of the third resistor R3 is coupled to the output terminal of the first voltage buffer 221. One terminal of the fourth resistor R4 is coupled to the output terminal of the third voltage buffer 223. The other terminal of the third resistor R3 is coupled to the other terminal of the fourth resistor R4. In addition, the other terminal of the third resistor R3 and the other terminal of the fourth resistor R4 output the third common mode voltage signal VCMA. Specifically, the third resistor R3 and the fourth resistor R4 may be configured to detect the average voltage value of the third differential input signal Vp1 and the fourth differential input signal Vn1 so as to generate the third common mode voltage signal VCMA. In an embodiment, the resistance values of the third resistor R3 and the fourth resistor R4 are different from the resistance values of the first resistor R1 and the second resistor R2 so as to generate different RC delays.

The output circuit 240 includes a first differential amplifier 241, a second differential amplifier 242, and an adder-subtractor 243. The first differential amplifier 241 generates a first output signal S1 according to the third differential input signal Vp1 and the fourth differential input signal Vn1. Specifically, the first differential amplifier 241 compares the third differential input signal Vp1 with the fourth differential input signal Vn1, and provides the first output signal S1 at the output terminal according to the difference between them. The second differential amplifier 242 generates a second output signal S2 according to the second common mode voltage signal VCM2 and the third common mode voltage signal VCMA. Similarly, the second differential amplifier 242 compares the second common mode voltage signal VCM2 with the third common mode voltage signal VCMA, and provides the second output signal S2 at the output terminal according to the difference between them. The adder-subtractor 243 is coupled to the output terminal of the first differential amplifier 241 and the output terminal of the second differential amplifier 242, and performs addition and subtraction operations according to the first output signal S1 and the second output signal S2 to generate the deskew output signal Vout. It can be seen that the first output signal S1 can be corrected to the deskew output signal Vout according to the second output signal S2.

It should be noted that, in this embodiment, the first voltage buffer 221, the second voltage buffer 222, and the third voltage buffer 223 can isolate the second common mode voltage generating circuit 230 so that the impedance values of the third resistor R3 and the fourth resistor R4 in the second common mode voltage generating circuit 230 does not affect the terminal impedance of the differential signal receiver 103. Accordingly, the impedance values of the third resistor R3 and the fourth resistor R4 may be set regardless of the input impedance value specified by the communication interface standard. In an embodiment, the resistance values of the third resistor R3 and the fourth resistor R4 may be smaller than the resistance values of the first resistor R1 and the second resistor R2, which is more suitable for high-speed transmission.

For example, the following takes the USB 3.0 standard (i.e., USB 3.1 Gen 1 or USB 3.2 Gen 1×1) as an example. According to the USB 3.0 standard, the transmission rate of the USB 3.0 standard is 5 Gbps, and the single-ended terminal impedance of the receiving terminal should be kept between 36 ohms and 60 ohms. Assuming that the terminal impedance is set to 50 ohms, the bandwidth requirement is set to 2.5 times the transmission rate, that is, about 12.5 Gbps. Under this condition, to achieve the transmission bandwidth requirement of 12.5 Gbps, based on that the relationship between the RC time constant and the bandwidth is $$2\pi f = \frac{1}{RC}, 2\pi \times 12.5G = \frac{1}{RC}.$$

Figure 5:
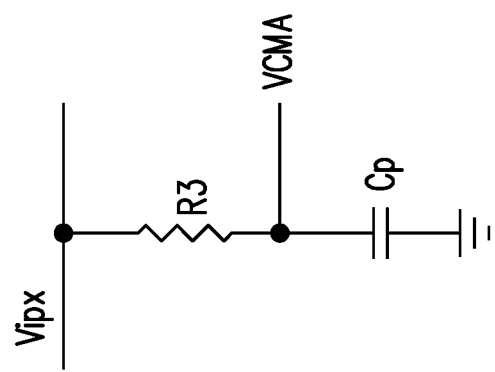
FIG. 5 is an equivalent circuit diagram showing the presence of parasitic capacitance when no voltage buffer circuit is provided.

In the case where the voltage buffer circuit 220 is not provided, please refer to FIG. 5, which is an equivalent circuit diagram showing the presence of parasitic capacitance when no voltage buffer circuit is provided. Assuming that the parasitic capacitance Cp connected in series between the reference ground terminal and the third resistor R3 is 10 farads (f), the impedance value of the third resistor R3 is 1.27 k ohms according to the aforementioned formula $$\left(2\pi \times 12.5G = \frac{1}{R \times 10}\right).$$

Similarly, the impedance value of the fourth resistor R4 may also be 1.27 k ohms. In this case, it is assumed that the impedance value of the first resistor R1 and the second resistor R2 is 1M ohms, and the pre-stage impedance of the previous circuit (not shown) of the deskew circuit 20 is 50 ohms. When the pre-stage impedance is connected in parallel with the first resistor R1 and connected in parallel with the third resistor R3, the equivalent impedance is 48.1 ohms, which has a deviation of 3.8% from the preset 50 ohms.

It can be seen from the above that, to increase the transmission rate without disposing a voltage buffer circuit, the impedance value of the third resistor R3 needs to be reduced. However, once the impedance value of the third resistor R3 is reduced, it affects the overall terminal impedance of the differential signal receiver 103, which may even not meet the set impedance matching. For example, under the same setting described above, when the transmission rate is to be increased to 10 Gpbs that meets the USB 3.2 Gen 2 standard, the impedance value of the third resistor R3 needs to be reduced to at least 636 ohms. In this case, the equivalent impedance of the pre-stage impedance connected in parallel with the first resistor R1 and connected in parallel with the third resistor R3 is 46.3 ohms, and the deviation from the preset 50 ohms increases to 7.2%.

Figure 6:
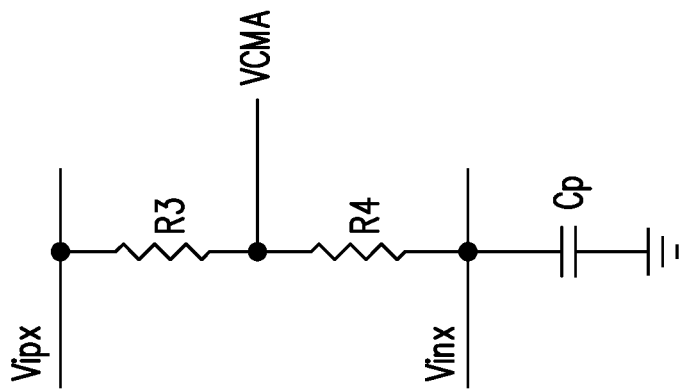
FIG. 6 is an equivalent circuit diagram showing the presence of parasitic capacitance when a voltage buffer circuit is provided.

On the other hand, please refer to FIG. 6, which is an equivalent circuit diagram showing the presence of parasitic capacitance when a voltage buffer circuit is provided. In the case where the voltage buffer circuit 220 is provided, due to the characteristics of high input impedance of the voltage buffer circuit, the overall terminal impedance of the differential signal receiver 103 is not affected regardless of the values of the third resistor R3 and the fourth resistor R4. Here, it is also assumed that the impedance value of the first resistor R1 and the second resistor R2 is 1M ohms, and the pre-stage impedance of the previous circuit (not shown) of the deskew circuit 20 is 50 ohms. Then, when the pre-stage impedance is connected in parallel with the first resistor R1 and the third resistor R3, the equivalent impedance is 49.97 ohms, which meets the USB 3.0 standard and has only a deviation of 0.06% from the preset 50 ohms. It can be seen that when the voltage buffer circuit is provided to block the influence of the third resistor R3 and the fourth resistor R4 on the pre-stage impedance, the terminal impedance matching is effectively stabilized.

In summary, according to the embodiments of the disclosure, a voltage buffer circuit is provided between the first common mode voltage generating circuit and the second common mode voltage generating circuit. The voltage buffer circuit has a high input impedance to isolate the second common mode voltage generating circuit and the signal input terminal. Therefore, the circuit components in the second common mode voltage generating circuit do not affect the input impedance of the differential signal receiver. As a result, the circuit components in the second common mode voltage generating circuit can be set more flexibly while meeting the requirement of impedance matching specified by the transmission standard. Thus, the embodiments of the disclosure are suitable for applications of high-speed transmission.

It should be noted that the above embodiments are provided to illustrate not to limit the technical solutions of the disclosure. Although the disclosure has been described in detail with reference to the foregoing embodiments, those of ordinary skill in the art should understand that it is possible to modify the technical solutions described in the foregoing embodiments or equivalently replace some or all of the technical features. Such modifications or replacements do not cause the essence of the corresponding technical solutions to deviate from the scope of the technical solutions of the embodiments of the disclosure.

What is claimed is:

1. A deskew circuit for a differential signal, adapted to be disposed in a differential signal receiver, comprising:
a first common mode voltage generating circuit generating a first common mode voltage signal according to a first differential input signal and a second differential input signal;
a voltage buffer circuit coupled to the first common mode voltage generating circuit and having an input impedance, wherein the input impedance is higher than a preset value, and the voltage buffer circuit buffering the first common mode voltage signal, the first differential input signal, and the second differential input signal to generate a second common mode voltage signal, a third differential input signal, and a fourth differential input signal;
a second common mode voltage generating circuit coupled to the voltage buffer circuit and generating a third common mode voltage signal according to the third differential input signal and the fourth differential input signal; and
an output circuit coupled to the second common mode voltage generating circuit and the voltage buffer circuit and generating a deskew output signal according to the third differential input signal, the fourth differential input signal, the second common mode voltage signal, and the third common mode voltage signal.

2. The deskew circuit for the differential signal according to claim 1, further comprising a coupling circuit coupled to the first common mode voltage generating circuit and receiving a differential transmission signal to generate the first differential input signal and the second differential input signal according to a capacitance value.

3. The deskew circuit for the differential signal according to claim 1, wherein the voltage buffer circuit comprises a first voltage buffer, a second voltage buffer, and a third voltage buffer, wherein the first voltage buffer is configured to buffer the first differential input signal to generate the third differential input signal, the second voltage buffer is configured to buffer the first common mode voltage signal to generate the second common mode voltage signal, and the third voltage buffer is configured to buffer the second differential input signal to generate the fourth differential input signal.

4. The deskew circuit for the differential signal according to claim 3, wherein the first common mode voltage generating circuit comprises a first resistor and a second resistor, wherein one terminal of the first resistor receives the first differential input signal and is coupled to an input terminal of the first voltage buffer, one terminal of the second resistor receives the second differential input signal and is coupled to an input terminal of the third voltage buffer, the other terminal of the first resistor and the other terminal of the second resistor are coupled to a voltage source and output the first common mode voltage signal to the second voltage buffer.

5. The deskew circuit for the differential signal according to claim 4, wherein a resistance value of the first resistor is equal to a resistance value of the second resistor.

6. The deskew circuit for the differential signal according to claim 3, wherein the second common mode voltage generating circuit comprises a third resistor and a fourth resistor, wherein one terminal of the third resistor is coupled to an output terminal of the first voltage buffer, one terminal of the fourth resistor is coupled to an output terminal of the third voltage buffer, and the other terminal of the third resistor and the other terminal of the fourth resistor output the third common mode voltage signal.

7. The deskew circuit for the differential signal according to claim 6, wherein the first common mode voltage generating circuit comprises a first resistor and a second resistor, wherein one terminal of the first resistor receives the first differential input signal, one terminal of the second resistor receives the second differential input signal, the other terminal of the first resistor is coupled to the other terminal of the second resistor, and a resistance value of the third resistor and the fourth resistor is smaller than a resistance value of the first resistor and the second resistor.

8. The deskew circuit for the differential signal according to claim 1, wherein the output circuit comprises:
a first differential amplifier generating a first output signal according to the third differential input signal and the fourth differential input signal;
a second differential amplifier generating a second output signal according to the second common mode voltage signal and the third common mode voltage signal; and
an adder-subtractor coupled to an output terminal of the first differential amplifier and an output terminal of the second differential amplifier, and performing addition and subtraction operations according to the first output signal and the second output signal to generate the deskew output signal.

9. The deskew circuit for the differential signal according to claim 6, wherein a resistance value of the third resistor is equal to a resistance value of the fourth resistor.

10. The deskew circuit for the differential signal according to claim 6, wherein the output circuit comprises:
a first differential amplifier generating a first output signal according to the third differential input signal and the fourth differential input signal;
a second differential amplifier generating a second output signal according to the second common mode voltage signal and the third common mode voltage signal; and
an adder-subtractor coupled to an output terminal of the first differential amplifier and an output terminal of the second differential amplifier, and performing addition and subtraction operations according to the first output signal and the second output signal to generate the deskew output signal.

* * * * *